United States Patent
Dudkiewicz et al.

(10) Patent No.: US 9,712,134 B2
(45) Date of Patent: Jul. 18, 2017

(54) ULTRA-WIDEBAND IMPEDANCE TUNER

(71) Applicant: Maury Microwave, Inc., Ontario, CA (US)

(72) Inventors: Steven M. Dudkiewicz, Toronto (CA); Gary R. Simpson, Fontana, CA (US)

(73) Assignee: Maury Microwave, Inc., Ontario, CA (US)

( * ) Notice: Subject to any disclaimer, the term of this patent is extended or adjusted under 35 U.S.C. 154(b) by 137 days.

(21) Appl. No.: 14/446,855

(22) Filed: Jul. 30, 2014

(65) Prior Publication Data

US 2015/0035613 A1    Feb. 5, 2015

Related U.S. Application Data (60) Provisional application No. 61/860,792, filed on Jul. 31, 2013.

(51) Int. Cl.
| | |
|---|---|
| *H03H 7/38* | (2006.01) |
| *H03H 7/40* | (2006.01) |
| *H01P 5/04* | (2006.01) |

(52) U.S. Cl.
CPC ............. *H03H 7/40* (2013.01); *H01P 5/04* (2013.01)

(58) Field of Classification Search
CPC .................................. H03H 7/40; H03H 7/38
USPC .................................................. 333/17.3, 263
See application file for complete search history.

(56) References Cited

U.S. PATENT DOCUMENTS

| | | | |
|---|---|---|---|
| 7,034,629 B2 | 4/2006 | Tsironis | |
| 7,053,628 B1 | 5/2006 | Tsironis | |
| 7,589,601 B2 | 9/2009 | Simpson | |
| 8,188,816 B1 | 5/2012 | Tsironis | |
| 8,212,628 B1 | 7/2012 | Tsironis | |
| 8,427,255 B1 | 4/2013 | Tsironis | |
| 8,823,392 B2 | 9/2014 | Meierer | |
| 2007/0171008 A1* | 7/2007 | Boulerne | G01R 1/26 333/263 |
| 2012/0049970 A1 | 3/2012 | Simpson | |

OTHER PUBLICATIONS

Christos Tsironis, et al., A Four Harmonic Wideband Impedance Tuner, Focus Microwaves, Inc., 2009.
Patent Cooperation Treaty (PCT) Application PCT/US2014/048961, International Search Report and Written Opinion of the International Searching Authority, mailed Nov. 21, 2014.

* cited by examiner

*Primary Examiner* — Stephen E Jones
(74) *Attorney, Agent, or Firm* — Larry K. Roberts (57) ABSTRACT

A mechanical impedance tuner has at least two probe carriages mounted for movement along an axis parallel to the center conductor. The at least two probe carriages including a first probe carriage and a second probe carriage. Each probe carriage has at least N probes where N is an integer equal to or greater than one, and at least one of the N probes is mechanically different or of different nominal geometry from the probes on at least one of the other carriages so that each such probe has an non-identical frequency response.

16 Claims, 7 Drawing Sheets

ULTRA-WIDEBAND IMPEDANCE TUNER

CROSS-REFERENCE TO RELATED APPLICATION

This application claims priority from provisional application No. 61860792, filed Jul. 31, 2013, the entire contents of which application is incorporated herein by this reference.

BACKGROUND

Figure 1A:
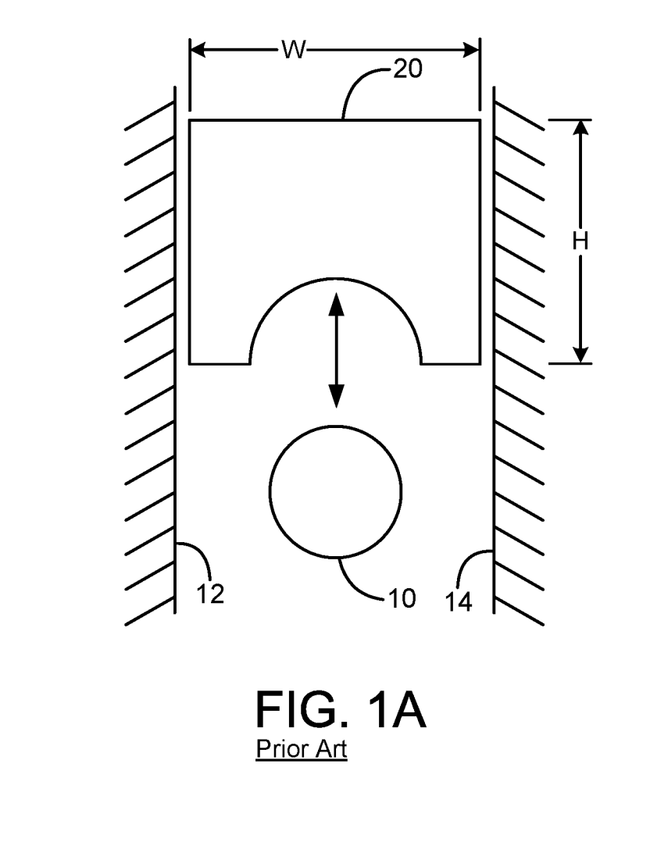
FIG. 1A is a diagrammatic end view of an impedance tuner slab line and probe arrangement.
Figure 1B:
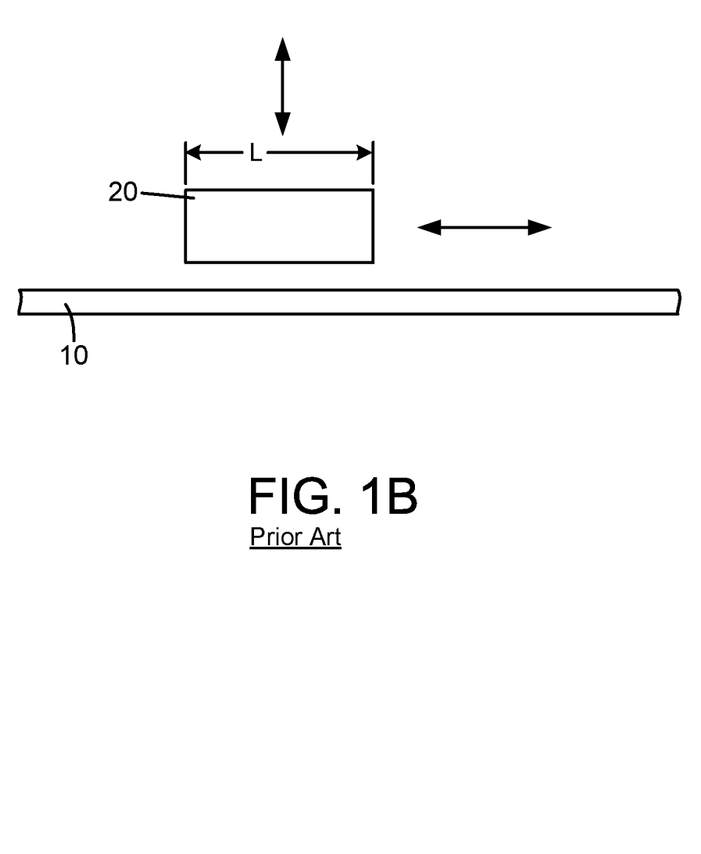
FIG. 1B is a diagrammatic view illustrating movement of the probe in the vertical (transverse to the center conductor) and horizontal (parallel to the center conductor) movement of the tuner probe.

Mechanical Impedance tuners are widely used in characterization of RF devices. The most common type of impedance tuner is the slab line tuner, which typically includes a 50 Ohm TEM slab line, with a movable mismatch probe. FIGS. 1A and 1B illustrate such a tuner in simplified form, with a center conductor 10 supported between opposed conductive ground planes 12, 14 which form the slab line. A mismatch probe 20 is supported for movement along or horizontal to the center conductor, and also in a direction traverse to or vertical to the center conductor. If the mismatch probe is moved out of the electrical fields of the slab line, it has almost no effect, allowing the slab line to look like a good 50 Ohm (characteristic impedance) line. However, if the mismatch probe is moved close to the center conductor, the electrical fields are affected, causing a mismatch. The magnitude of the mismatch is controlled primarily by adjusting the distance of the probe from the center conductor. The phase of the mismatch is controlled by moving the probe in a direction parallel to the center conductor. A similar effect can also be done in other transmission line environments, such as waveguide.

Mismatch probes have a frequency response based on their geometry. Here, the frequency response of the probe is in the context of the probe being mounted appropriately in the tuner. In principle, longer probes will have a "flat" operating response at lower frequencies, whereas shorter probes will have a "flat" operating response at higher frequencies. In this document, the "flat" operating response of a probe is defined to be a reflection response that occurs in the frequency range where the maximum reflection (or VSWR) is equal or greater than some specified value.

Typical impedance tuners use one, two, or three mismatch probes in a single carriage in order to increase the overall operational frequency bandwidth of the tuner.

BRIEF DESCRIPTION OF THE DRAWINGS

Features and advantages of the disclosure will readily be appreciated by persons skilled in the art from the following detailed description when read in conjunction with the drawing wherein.

DETAILED DESCRIPTION

In the following detailed description and in the several figures of the drawing, like elements are identified with like reference numerals. The figures may not be to scale, and relative feature sizes may be exaggerated for illustrative purposes.

Mechanical impedance tuners use mismatch probes 20 (FIGS. 1A and 1B) in order to interrupt the electric field passing through the tuner. By interrupting the electric field, mismatch probes are able to change the impedance presented to a device under test (DUT).

When the probe is sufficiently far from the center conductor, it has little to no effect on the VSWR (Voltage Standing Wave Ratio) presented by the tuner; only the tuner's VSWR (or system impedance) is presented to the DUT.

As the probe is lowered and approaches the center conductor, the amount of energy interrupted by the probe increases, and the VSWR presented by the tuner increases.

At some position close to the center conductor, the probe achieves its maximum influence and the tuner presents its highest VSWR.

Figure 2:
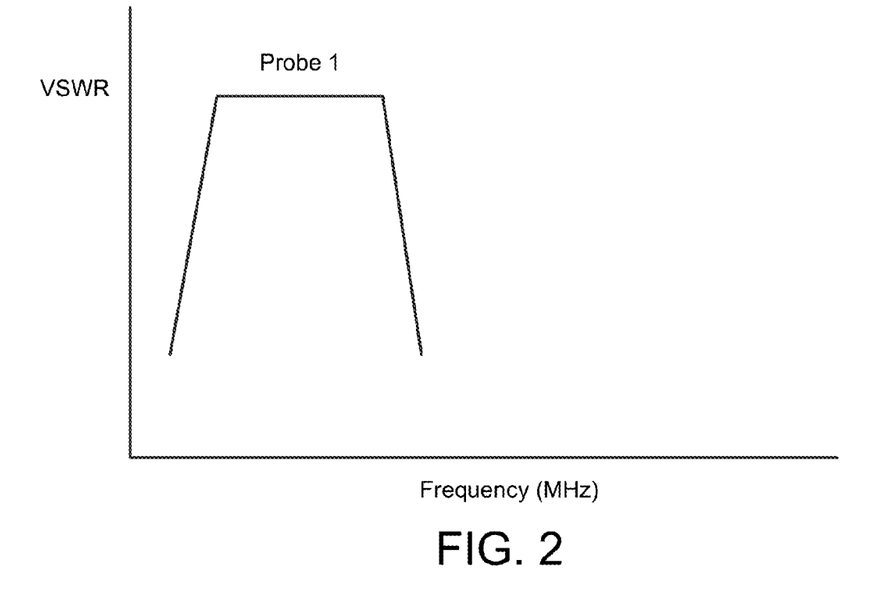
FIG. 2 is a typical frequency response of a mismatch probe, having flat reflectivity in a given frequency bandwidth.

The mismatch probe has a unique frequency response which corresponds to its geometry and that of the slab line assembly which includes the slab lines 12 and 14 and center conductor 10 (FIG. 1A). In principle, longer probes will have a flat operating response at lower frequencies, whereas shorter probes will have a flat operating response at higher frequencies. An exemplary probe response (VSWR as a function of frequency) is shown in FIG. 2.

Modern impedance tuners are equipped with one, two or three (or more) mismatch probes mounted on a carriage. Exemplary impedance tuners and probes are described in US 20120049970 and U.S. Pat. No. 7,589,601, the entire contents of which are incorporated herein by this reference. FIGS. 8-11 of U.S. Pat. No. 7,589,601 depict multi-section probes, which may be used in embodiments of the present invention.

Figure 3:
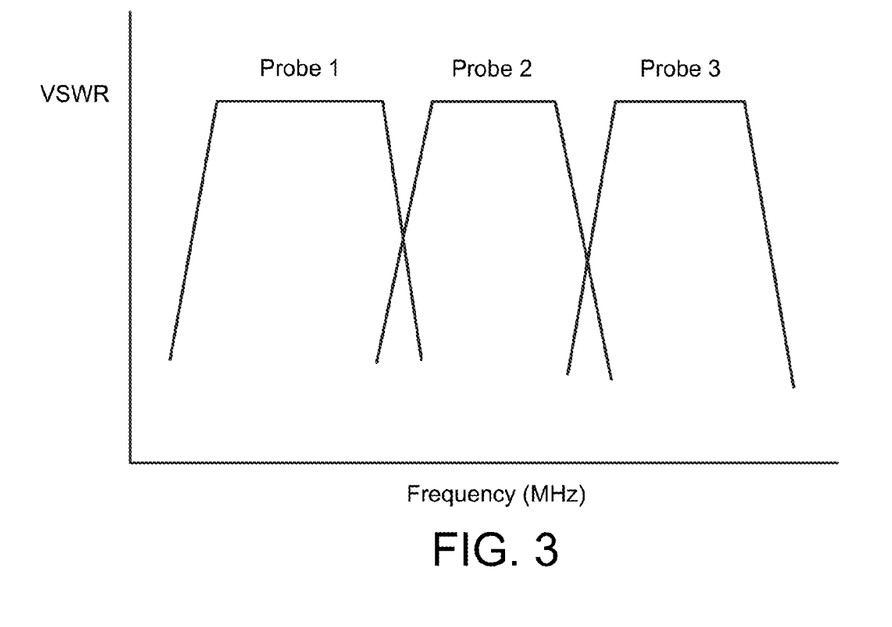
FIG. 3 is the ultra-wideband frequency response when using probes of different geometries each having a different frequency response.

In some mechanical tuners, each probe on a given carriage has a different geometry from that of the other probes on the same carriage, and in turn a different frequency response. Each probe on a given carriage is used independently to cover its own frequency band with only minor overlap. In this manner, the impedance tuner can achieve a much wider operating bandwidth than if it had only a single mismatch probe, as shown in FIG. 3.

Two- and three-carriage tuners exist where each carriage holds one, two or three mismatch probes. However, the set of probes employed by each carriage are the same. This is a requirement for specific forms of advanced measurements referred to as "pre-match load pull" or "cascaded-probe harmonic load pull".

FIGS. 4A-4D illustrate a two-carriage tuner 50 where each carriage (60, 70) holds two non-similar probes P1 and P2 in carriage 60, and P3 and P4 in carriage 70. Each probe has a different geometry and therefore has a different operating bandwidth or frequency response. By using these probes, one at a time, the tuner 50 is configured to achieve an ultra-wide band of operation. No matter how many probes of different geometries are in the system, only one is used at a time in an exemplary "single-probe-at-a-time" mode of operation, since each has its own unique frequency band in which to operate. If the tuner has four probes, with two probes per carriage, for example, and each probe covers a different band, then for a given frequency of interest, and during one mode of tuner operation, only one probe will be used, i.e. in an active state or position, to affect the tuner impedance, and the other three will be retracted, i.e. placed in an inactive state or position, so as not to affect the tuner impedance or signal. If the probe in use is in the first carriage, the second carriage would be initialized and out of the way against the opposite wall. For instance, if the probe being used was in the leftmost carriage, then all the unused carriages would be shifted to the right to the opposite wall, with the probes in the unused carriages retracted.

The probe "geometry" can include features such as height, width and length dimensions (H, W, L, FIGS. 1A and 1B) of the probe, as well as the curvature. In one embodiment, the probes 1, 2, 3 and 4 might have the same width and height, but different lengths, or the same length and height, but different widths, and so on. Other geometries may be defined by other features of the probe, such as curvature at the probe end adjacent the center conductor. What is desired is that each carriage carry a movable probe which presents a different and, and in some embodiments, non-overlapping frequency response band, relative to a probe carried by each of the other carriages. While changing the width and curvature of the probe can have some effect on its frequency response, in an exemplary embodiment, the length dimension is found to more directly affect the frequency response. Longer probes provide lower frequencies of operation, and shorter probes higher frequencies of operation. For example, the four probes P1, P2, P3, P4 could have geometries configured to provide frequency responses as shown in FIG. 4C. In another example, the geometries are defined by the same height and width, but different lengths. By way of further example, one carriage has two probes of different lengths, a probe 1 length of 1.23" covering 0.6-2.8 GHz, and a probe 2 length 0.8" covering 2.8-4.6 GHz. A second carriage also has two probes of different length, probe 1 length of 0.387" covering 2.8-8 GHz and probe 2 length 0.205" covering 8-18 GHz. The tuner having these two carriages with four probes can then be operated in a "single-active-probe-probe-at-a-time" mode, where only one of the four probes is active (i.e. affecting the tuner VSWR, the other probes retracted so as not to affect the VSWR), and effectively cover a frequency range between 0.6-18 GHz. This is merely intended as an example; and other probes of different frequency response characteristics may be employed.

In the case of multi-section probes, e.g. as illustrated in FIGS. 8-10 of U.S. Pat. No. 7,589,601, in one exemplary embodiment, each section of a first multi-section probe mounted for operation in a first carriage may have a different geometry from corresponding sections of a second multi-section probe mounted for operation in a second carriage. In another embodiment, a multi-section probe may be mounted on one carriage, and a single probe mounted on another carriage, and the multi-section probe and single probes have different frequency responses to cover different frequency bands in a single probe mode of operation.

Figure 6:
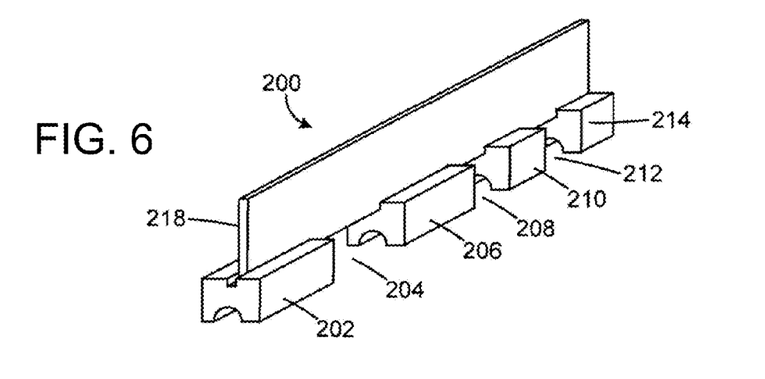
FIG. 6 is a schematic diagram of an exemplary embodiment of a multi-section probe with a thin holder connecting the four sections.
Figure 7:
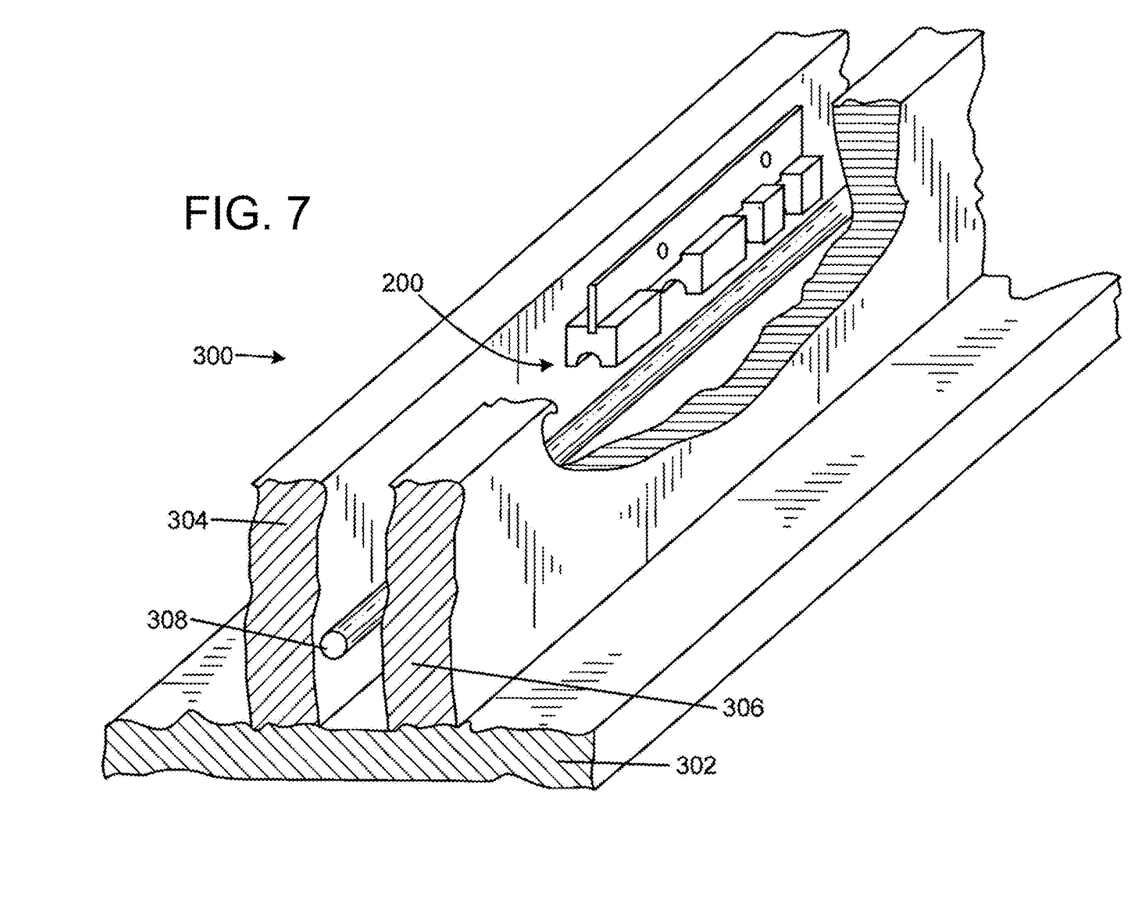
FIG. 7 illustrates the multi-section probe of FIG. 6 in the context of an exemplary slab line transmission line of an impedance tuner.

FIG. 6 (corresponding to FIG. 10 of U.S. Pat. No. 7,589,601) is an isometric of an exemplary embodiment of a multi-section probe 200 with a thin holder 218 connecting the four probe sections 202, 206, 210, 214. The thickness of the holder is thinner than the probes, so that the fields to ground will mostly be from the probe sections to the slab line walls. In the case of a thin metal holder structure, the probe and holder may be fabricated as a unitary structure. FIG. 7 (corresponding to FIG. 11 of U.S. Pat. No. 7,589,601) illustrates the multi-section probe of FIG. 6 in the context of a slab line transmission line 300. Here, the line 300 includes a base plate 302 and separated parallel ground plane slabs 304, 306 mounted transversely on the top of the base plate. A center conductor 308 is supported between the ground plane slabs 304, 306. The probe structure 200 may be mounted for movement along the center conductor, and also transversely to the center conductor, as illustrated with respect to FIG. 4A.

Figure 4A:
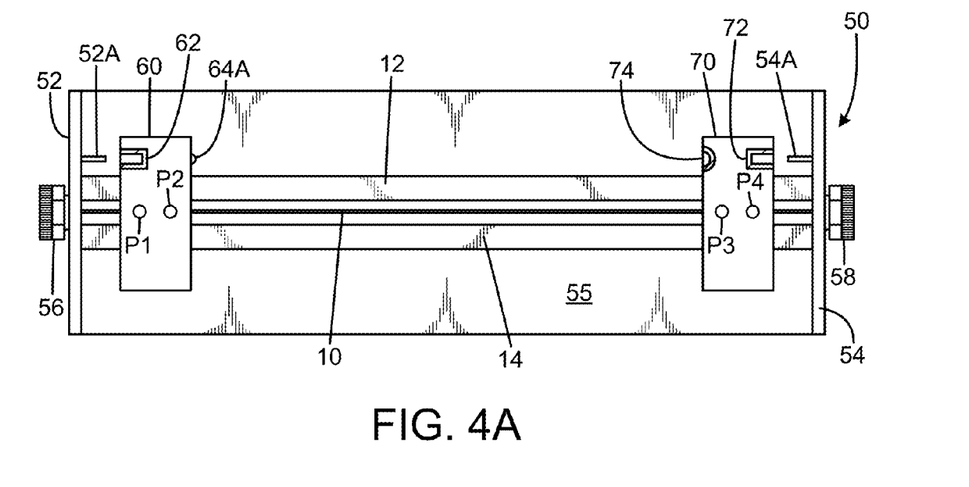
FIG. 4A is a diagrammatic top view illustrating features of an exemplary embodiment of a two-carriage impedance tuner.

A multi-section probe may be mounted on a carriage as depicted in FIG. 4A, and the whole probe moved along the center conductor to control the phase.

FIG. 4A illustrates an exemplary embodiment of a two-carriage impedance tuner 50, with two carriages 60 and 70. The tuner 50 includes a pair of opposed or end walls 52 and 54 on which the center conductor 10 is supported by dielectric bushings (not shown). The end walls are mounted to a bottom plate 55. The opposed conductive ground planes 12, 14 are supported between the end walls. RF connectors 56, 58 are provided for making electrical connection to the center conductor on opposed sides of the tuner. Connector 56 is typically connected or coupled to a device under test (DUT).

Still referring to FIG. 4A, probe carriages 60 and 70 are mounted for movement along an axis parallel to the center conductor 10. Typically the carriages are mounted on guide rails (not shown in FIG. 4A). One rail may have a linear gear rack, for engagement by a rotatable gear mounted on each carriage and driven by a carriage motor, typically a stepper motor, although other types of motors may alternately be employed. By driving the rotatable gear with the carriage motor, a carriage can be moved along the horizontal direction. Since each carriage motor can be independently driven, this allows the carriages to be positioned independently of each other. Other arrangements for positioning the carriage may also be employed, e.g. drive belts or leadscrews.

Carriage 60 has a sensor 62 mounted on the carriage side facing end wall 52, which is configured to sense a pin or other feature 52A extending from the end wall. Similarly, carriage 70 has a sensor 72 mounted on the carriage side facing end wall 54, which is configured to sense a pin or other feature 54A extending from the end wall 54.

Figure 4B:
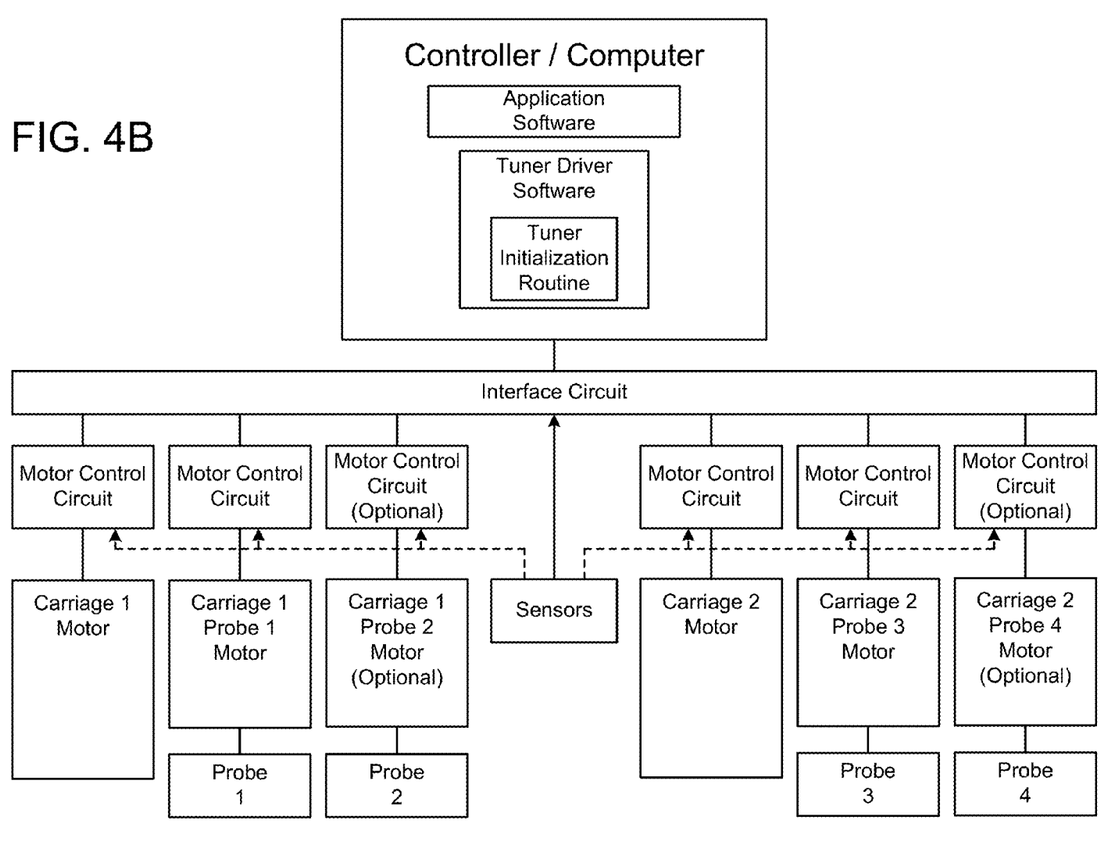
FIG. 4B is a simplified schematic block diagram illustrating an exemplary embodiment of features for an exemplary two-carriage impedance tuner system such as is shown in FIG. 4A.
Figure 4C:
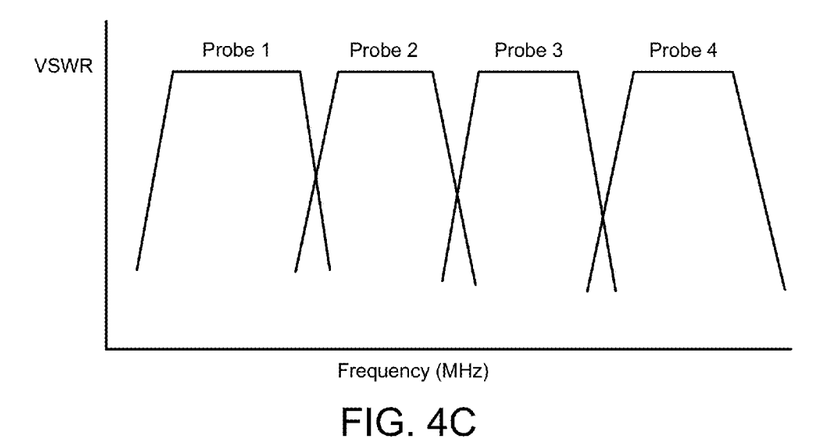
FIG. 4C shows an exemplary frequency response of the four probes used in the tuner of FIG. 4A.

FIG. 4B is a simplified schematic block diagram illustrating an exemplary embodiment of features for an exemplary two-carriage impedance tuner system such as tuner system 50. A controller/computer may be a device or system remotely located relative to the impedance tuner 50, or in some cases built into the tuner. The controller/computer is typically programmable, and includes application software configured to control operation of the tuner, e.g. for testing DUTs in various test modes, e.g. without limitation load pull, source pull, noise parameter measurements, and ruggedness testing. The controller/computer also includes tuner driver software configured to provide drive commands to the tuner motors, under control of the application software. The tuner driver software includes a tuner initialization routine or algorithm, configured to initialize the tuner upon power up or reset. The initialization routine in this embodiment carries out the carriage initialization to determine initial or zero positions of the carriage motors. The controller/computer is connected to an interface circuit, e.g. a USB interface circuit, to which are connected the motor control circuits for the carriage (horizontal drive) and probe (vertical drive) motors and, in an exemplary embodiment, the sensors, including sensors 62, 72 and 74.

In this exemplary embodiment, each carriage 60 and 70 hold two probes spaced apart along the horizontal direction, and each probe is vertically (i.e. transverse to the axis of the center conductor) positioned by a probe motor (1 and 2 for each carriage) from a position very close, but not in contact with, the center conductor to a position spaced away from the center conductor by a sufficient distance that the probe in this position does not affect the fields to a significant degree. Thus, the probe motors each are configured to position the corresponding probe at a selected vertical position within this range of motion. In this embodiment, the carriage 1 (60) motor (horizontal drive) is driven by a motor control circuit, and the respective carriage 1 probe 1 and carriage 1 probe 2 motor (vertical drive) are each driven by a motor control circuit, all under control of the controller/computer. Similarly, the carriage 2 (70) motor (horizontal drive) is driven by a motor control circuit, and the respective carriage 2 probe 3 and carriage 2 probe 4 motor (vertical drive) are each driven by a motor control circuit, all under control of the controller/computer. The sensor signals may be processed by the controller/computer, or by the motors or the motor control circuits, depending on the implementation. In other embodiments, each carriage may support a single probe, or more than two probes.

Figure 4D:
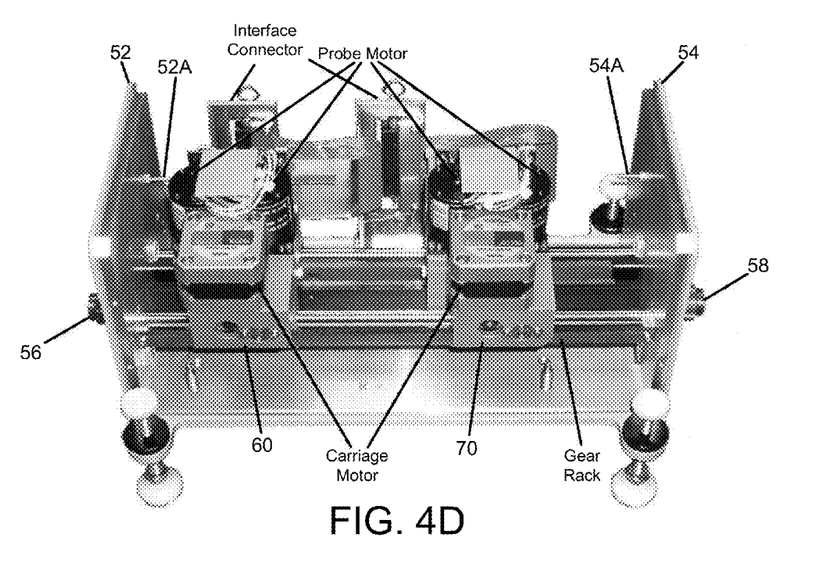
FIG. 4D is an image of the tuner of FIG. 4A.

FIG. 4D is an image of an exemplary two carriage tuner 50 as described in FIGS. 4A-4C.

An ultra-wideband tuner as described herein is advantageous for several reasons. The first is that the user might have needs in different frequency bands. With standard tuners, the user might need to purchase several tuners to meet his requirements. As an example, if one tuner goes from 0.4-4 GHz and another from 1.8-18 GHz, and the user had requirements at both 1 GHz and 12 GHz, he would need to buy two tuners. With one ultra-wideband tuner, the customer would be able to purchase a single unit to meet his various requirements. A second scenario is a customer who wishes to measure the wideband performance of a transistor for some parameter, say noise parameters. With traditional tuners, the customer would need to take the first tuner, perform the system assembly, calibration, measurement at the operating frequency limits of the tuner, then disassemble his system, replace tuners, and start again. Whereas with an ultra-wideband tuner, the measurements can be done in one connection. The first probe is positioned into the slab line while probes P2, P3, P4 are retracted, and the measurements are taken under the operating bandwidth of the tuner. Then probe P1 is retracted along with probes P3 and P4, and probe P2 is lowered into the slab line and the measurements are repeated, with similar operations repeated for probes P3 and P4.

It is important to note that although two-carriage tuners already exist, this is the first time where non-similar probes, i.e. probes of different geometries and different frequency responses are mounted in each carriage, and that the carriages are used only once at a time with a single active probe to achieve a wider bandwidth of operation.

Figure 5:
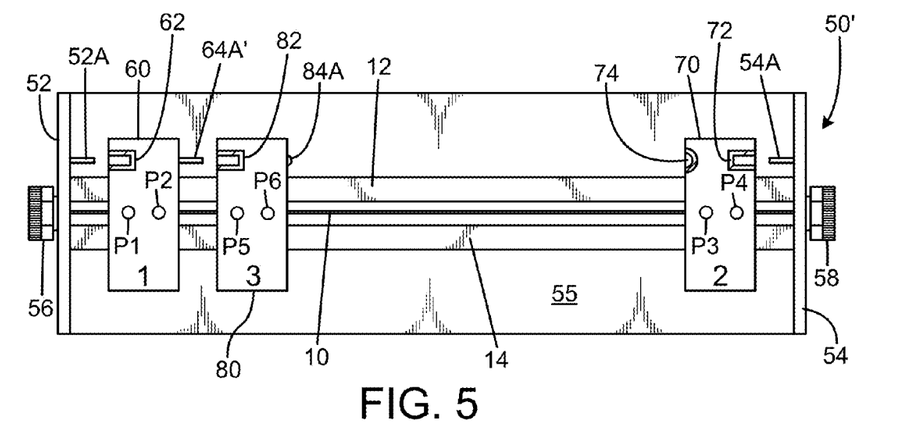
FIG. 5 is a diagrammatic top view illustrating features of an exemplary embodiment of a three-carriage impedance tuner.

FIG. 5. illustrates an exemplary three-carriage tuner where each carriage 60, 70 and 80 holds two non-similar probes. Carriage 60 holds probes P1 and P2, carriage 70 probes P3 and P4, and carriage 80 probes P5 and P6 Each probe has a different geometry and therefore has a different operating bandwidth. By using these six probes, one at a time, the tuner is configured to achieve an ultra-wide band of operation.

It is important to note that although two-carriage and three-carriage tuners already exist, this is the first time where non-similar probes are mounted in each carriage, and that the carriages and probes are used only one at a time to achieve a wider bandwidth of operation. Each carriage in an exemplary embodiment of a multi-carriage impedance tuner may have one or more probes, and each carriage has at least one probe that is different from at least one probe on at least one of the other carriages. Thus, each probe carriage has at least N probes where N is an integer equal to or greater than one, and at least one of said N probes is mechanically different or of different nominal geometry from all probes on at least one of the other carriages so that each such different probe has an non-identical frequency response relative to the other different probes. By different "nominal" geometries, we mean that the probes are designed to have different geometries, to distinguish from cases in which probes which are nominally identical have slightly different geometries due to manufacturing tolerances.

In some embodiments, some probes may be the same on different carriages, although unnecessary for a "single-active-probe-at-a-time" mode of operation. For example, consider the three carriage tuner of FIG. 5. Probes P1, P3, P5, P6 may have different geometries with different frequency responses, e.g. non-overlapping, contiguous frequency responses, and may be used in a "single-active-probe-at-a-time" mode of operation. Probe P2 on carriage 60 and probe P4 on carriage 70 may be identical probes, which may be useful in a harmonic tuning mode of operation of the tuner.

Although the foregoing has been a description and illustration of specific embodiments of the subject matter, various modifications and changes thereto can be made by persons skilled in the art without departing from the scope and spirit of the invention. For example, additional probes could be added to the carriages which are not dissimilar to other probes, to provide additional functionality.

The invention claimed is:

1. A mechanical impedance tuner with at least two probe carriages, the tuner comprising:
   a center conductor;
   at least two probe carriages mounted for movement along an axis parallel to the center conductor, said at least two probe carriages including a first probe carriage and a second probe carriage;
   each probe carriage having at least N probes where N is an integer greater than one, and at least one of said N probes has a different nominal geometry from all probes on at least one of the other carriages;
   a carriage drive system for moving each probe carriage independently along said axis parallel to the center conductor;
   a probe drive system for moving each probe independently in a direction transverse to the center conductor through a range of motion; and
   a controller configured to operate said probe carriage drive system and said probe drive system.

2. The tuner of claim 1, wherein at least one of said probes having different geometries comprises a multi-section probe.

3. The tuner of claim 1, wherein each of said N probes of said first probe carriage has a different nominal geometry from each other probe on said first probe carriage.

4. The tuner of claim 1, wherein each probe in the tuner has a different geometry from every other probe in the tuner.

5. The tuner of claim 1, wherein each of said N probes has a different nominal geometry from all probes on at least one of the other carriages.

6. The tuner of claim 1, wherein the geometry of each probe is determined by features including probe height, width and length dimensions.

7. The tuner of claim 6, wherein said probes having different nominal geometries have the same width and height dimensions with different probe length dimensions to achieve different frequency responses.

8. The tuner of claim 1, wherein the controller is configured to operate the probe carriage drive system and the probe drive system in a single-probe-at-a-time mode of operation, in which only one of said probes is used as an active probe to affect an impedance presented by the tuner and the other probes are placed in inactive positions in which the other probes do not affect said impedance.

9. The tuner of claim 8, wherein each probe in the tuner has a different geometry from every other probe in the tuner.

10. The tuner of claim 8, wherein frequency responses of each of said probes having a different geometry when operated as the active probe are non-overlapping.

11. The tuner of claim 10, wherein said frequency responses present contiguous frequency bands of operation, wherein the composite frequency operational bandwidth of the tuner is the composite of the contiguous frequency bands.

12. A mechanical impedance tuner with at least two probe carriages, the tuner comprising:
- a center conductor;
- at least two probe carriages mounted for movement along an axis parallel to the center conductor, said at least two probe carriages including a first probe carriage and a second probe carriage;
- each probe carriage having at least N probes where N is an integer equal to or greater than one, and at least one of said N probes has a different nominal geometry from all probes on at least one of the other carriages;
- a carriage drive system for moving each probe carriage independently along said axis parallel to the center conductor;
- a probe drive system for moving each probe independently in a direction transverse to the center conductor through a range of motion; and
- a controller configured to operate said probe carriage drive system and said probe drive system; and
- wherein at least one probe on one of said carriages has an identical or near-identical frequency response as another probe on another of said carriages.

13. The tuner of claim 12, wherein said probe geometries are configured to provide respective contiguous frequency response bands of 0.6-2.8 GHz, 2.8-4.6 GHz, 2.8-8 GHz and 8-18 GHz, respectively.

14. A mechanical impedance tuner with at least three probe carriages, the tuner comprising:
- a center conductor;
- at least three probe carriages mounted for movement along an axis parallel to the center conductor, said at least three probe carriages including a first probe carriage, a second probe carriage and a third probe carriage;
- each probe carriage having at least N probes where N is an integer greater than one, wherein the first probe carriage has at least probes P1 and P2, the second probe carriage has at least probes P3 and P4, and the third probe carriage has at least probes P5 and P6, and wherein probes P1, P3, P5 and P6 have respectively different nominal geometries with respectively different nominal frequency responses, and wherein probes P2 and P4 have identical nominal geometries with identical nominal frequency responses;
- a carriage drive system for moving each probe carriage independently along said axis parallel to the center conductor;
- a probe drive system for moving each probe independently in a direction transverse to the center conductor through a range of motion; and
- a controller configured to operate said probe carriage drive system and said probe drive system.

15. The tuner of claim 14, wherein the controller is configured to operate the probe carriage drive system and the probe drive system in a single-probe-at-a-time mode of operation, in which only one of said probes is used as an active probe to affect an impedance presented by the tuner and the other probes are placed in inactive positions in which the other probes do not affect said impedance.

16. The tuner of claim 14, wherein the controller is configured to operate the tuner in a harmonic tuning mode of operation.

* * * * *